United States Patent
Meisburger et al.

(10) Patent No.: US 6,556,279 B1
(45) Date of Patent: Apr. 29, 2003

(54) MOTION COMPENSATION SYSTEM AND METHOD FOR LITHOGRAPHY

(75) Inventors: Dan Meisburger, San Jose, CA (US); David A. Markle, Saratoga, CA (US)

(73) Assignee: Ultratech Stepper, Inc., San Jose, CA (US)

(*) Notice: Subject to any disclaimer, the term of this patent is extended or adjusted under 35 U.S.C. 154(b) by 0 days.

(21) Appl. No.: 09/933,583

(22) Filed: Aug. 20, 2001

Related U.S. Application Data

(63) Continuation-in-part of application No. 09/854,226, filed on May 10, 2001.

(51) Int. Cl.[7] .................. G03B 27/72; G03B 27/42; A61N 5/00; G01B 11/02; G03F 9/00
(52) U.S. Cl. .................. 355/69; 355/53; 355/72; 355/75; 355/77; 250/492.2; 250/492.22; 356/356; 356/358; 356/363; 356/399; 430/22; 430/311
(58) Field of Search .................. 355/53, 69, 72, 355/75, 77; 250/492.2, 492.22; 356/356, 358, 363, 399; 430/22, 311

(56) References Cited

U.S. PATENT DOCUMENTS

| | | | |
|---|---|---|---|
| 4,980,896 A | * | 12/1990 | Forsyth et al. |
| 5,767,523 A | * | 6/1998 | McCullough |
| 5,880,817 A | * | 3/1999 | Hashimoto |
| 6,353,271 B1 | * | 3/2002 | Williams |

* cited by examiner

Primary Examiner—Alan A. Mathews
Assistant Examiner—Khaled Brown
(74) Attorney, Agent, or Firm—Allston L. Jones

(57) ABSTRACT

A system and method of compensating for image smear that arises when imaging onto a moving workpiece with a single pulse of radiation. The system includes a mask frame capable of supporting a mask to be imaged. The mask frame is operatively connected to a drive unit and is capable of moving in the mask plane. The mask frame is driven in an oscillatory fashion in the mask plane so that when a pulse of radiation illuminates the mask, the mask image moves in the same direction as the moving workpiece, thereby reducing image smear. The present invention is particularly applicable to single-pulse-exposure systems that utilize pulsed radiation sources having relatively long pulse duration, such as flash-lamps or certain types of lasers.

25 Claims, 3 Drawing Sheets

MOTION COMPENSATION SYSTEM AND METHOD FOR LITHOGRAPHY

CROSS REFERENCE

This application is a continuation-in-part of still pending U.S. patent application Ser. No. 09/854,226, filed May 10, 2001, entitled "Lithography System and Method for Device Manufacture."

BACKGROUND OF THE INVENTION

1. Field of the Invention

The present invention relates to lithography, and in particular relates to systems and methods for performing single-radiation-pulse exposures in a manner that reduces image smear.

2. Description of the Prior Art

The process of manufacturing certain micro-devices such as semiconductor integrated circuits (ICs), liquid crystal displays, micro-electro-mechanical devices (MEMs), digital mirror devices (DMDs), silicon-strip detectors and the like involves the use of high-resolution lithography systems. In such systems, a patterned mask (i.e., a reticle) is illuminated with radiation (e.g., laser radiation or radiation from an arc lamp) that passes through an illumination system that achieves a high-degree of illumination uniformity over the illuminated portion of the mask. The portion of the radiation passing through the mask is collected by a projection lens, which has an image field (also referred to as a "lens field") of a given size. The projection lens images the mask pattern onto an image-workpiece to produce a pattern either in a photosensitive layer on the workpiece surface or directly on the workpiece because of a reaction between the workpiece surface and the incident radiation. The workpiece resides on a workpiece stage that moves the workpiece relative to the projection lens, so that the mask pattern is repeatedly formed on the workpiece over multiple "exposure fields."

Lithography systems include an alignment system that precisely aligns the workpiece with respect to the projected image of the mask, thereby allowing the mask pattern to be precisely superimposed on previously exposed patterns. In most cases, the mask image needs to be precisely aligned to a pre-existing exposure field on the workpiece to provide the juxtaposed registration necessary to build up layers of the device being fabricated.

Presently, two types of lithography systems are used in manufacturing: step-and-repeat systems, or "steppers," and step-and-scan systems, or "scanners." With steppers, each exposure field on the workpiece is exposed in a single static exposure. With scanners, the workpiece is exposed by synchronously scanning the work piece and the mask across the lens image field. An exemplary scanning lithography system and method is described in U.S. Pat. No. 5,281,996. The projection lenses associated with steppers and scanners typically operate at 1X (i.e., unit magnification), or reduction magnifications of 4X or 5X (i.e., magnifications of ±1/4 and ±1/5, as is more commonly expressed in optics terminology).

The ability of a lithography system to resolve (or, more accurately, "print") features of a given size is a function of the exposure wavelength: the shorter the wavelength, the smaller the feature that can be printed or imaged. To keep pace with the continuously shrinking minimum feature size for many micro-devices (particularly for ICs), the exposure wavelength has been made shorter. Also, historically the device size has increased as well, so that the lens field size has steadily grown. The resolution of the lithography system also increases with the numerical aperture (NA) of the projection lens. Thus, in combination with reducing the exposure wavelength, the numerical apertures of projection lenses tend to be as large as can be practically designed, with the constraint that the depth of focus, which decreases as the square of the NA, be within practical limits.

A novel and unconventional lithography system that performs exposures using single pulses of radiation is described in U.S patent application Ser. No. 09/854,226, filed on May 10, 2001 by the present inventors and assigned to the same assignee and entitled "Lithography system and method for device manufacture," which application is incorporated herein by reference. This single pulse exposure system, referred to by the present assignee by the trademark CONTINUOUS LITHOGRAPHY™ lithography system, has many advantages. These include providing a high throughput equal to or greater than the most advanced lithography scanners using a smaller-than-conventional exposure field size. In the CONTINUOUS LITHOGRAPHY™ lithography system, the workpiece (wafer) moves continuously underneath the projection lens while exposure fields are formed on the workpiece with a single pulse of radiation. The temporal pulse length of the radiation pulses and the speed at which the workpiece moves is selected so that the exposure fields are imaged with a minimum of smearing of the mask image.

A preferred radiation source for the CONTINUOUS LITHOGRAPHY™ lithography system is a pulsed laser. However, while pulsed lasers can provide radiation pulses that are short and intense, they are also relatively expensive. This adds to the cost of the overall lithography system. To reduce the cost of the lithography system, a flash-lamp radiation source can be used. However, the temporal pulse lengths of a flash lamp are in the millisecond to microsecond range, with greater pulse energies being available from longer pulses. Thus, the image smear (blur) caused by imaging a fixed reticle onto a rapidly moving workpiece can be appreciable with a flash lamp source.

Accordingly, it would be greatly advantageous to be able to use a high-energy, long-pulse-duration flash lamp or long-pulse-duration laser in the single-pulse CONTINUOUS LITHOGRAPHY™ lithography system without experiencing the aforementioned image smearing.

SUMMARY OF THE INVENTION

The present invention relates to lithography, and in particular relates to systems and methods for performing single-radiation-pulse exposures in a manner that reduces image smear.

A first aspect of the invention is a mask holder system for oscillating a mask to provide motion compensation for performing single-pulse exposures of the mask onto a moving workpiece. The mask holder system includes a mask frame for supporting the mask. A drive unit is operatively connected to the mask frame for imparting an oscillatory motion to the mask frame that corresponds to the movement of the workpiece. The oscillation is coordinated with the single-pulse exposures so that the image of the mask and the workpiece move in the same direction at substantially the same speed during exposure.

An exemplary embodiment of the mask holder system utilizes parallel rails slidably connected to first and second sides of the mask frame to allow for the mask frame to move in a plane defined by the parallel rails.

A second aspect of the invention is a method of reducing image smear when forming an exposure field with a single pulse of radiation on a moving workpiece. The method includes oscillating a mask in a mask plane, and then illuminating a mask with a pulse of radiation while the mask moves in a direction such that an image of the mask moves in the same direction as the workpiece. The method further includes projecting an image of the mask onto the moving workpiece to form an exposure field. The method is repeated to form a plurality of adjacent exposure fields, with each exposure field formed from a single pulse of radiation. The radiation pulses may be from a flash-lamp or a pulsed laser (including a modulated continuous-wave laser); in either case, the radiation pulses have a temporal pulse length of about a microsecond or greater.

A third aspect of the invention is a lithography system for conducting single pulse exposures that includes a pulsed radiation source (i.e., a flash-lamp or pulsed laser), an illuminator for collecting the radiation pulses, the mask holder system as described above in connection with the first aspect of the invention, a projection lens and a workpiece stage. A mask is supported in the mask holder system. The motion of the workpiece via the workpiece stage, the oscillating motion of the mask, and the emission of pulses of radiation from the radiation source are coordinated by a main control unit so that the amount of image smear from imaging onto the moving workpiece is reduced.

DETAILED DESCRIPTION OF THE INVENTION

The present invention relates to lithography, and in particular relates to systems and methods for performing single-radiation-pulse exposures in a manner that reduces image smear.

Figure 1:
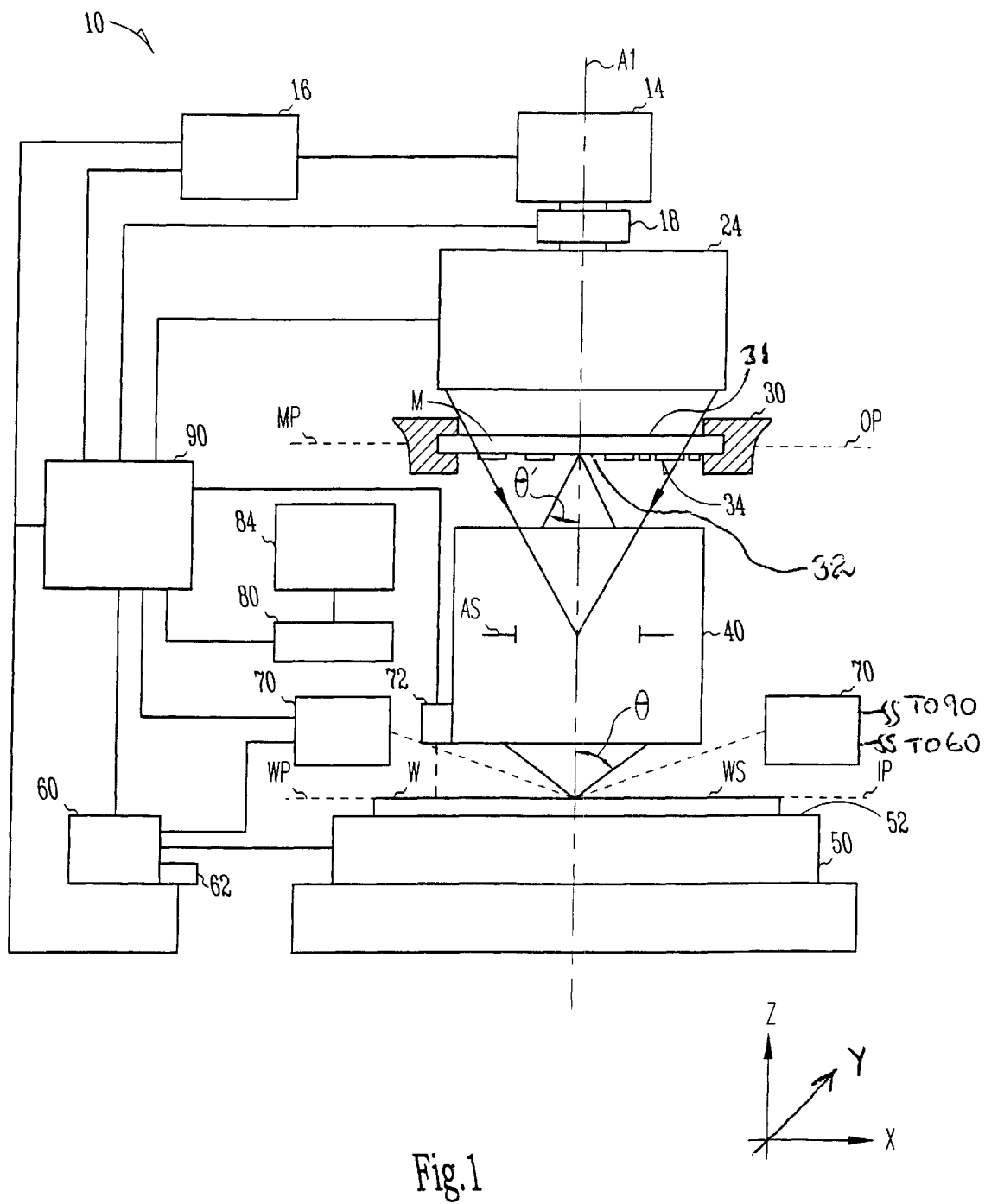
FIG. 1 is a schematic diagram of a lithography system for carrying out the method of the present invention, and which includes the mask holder system of the present invention.

With reference now to FIG. 1, there is shown a lithography system 10 suitable for use in carrying out the present invention. System 10 is also referred to herein by the trademark CONTINUOUS LITHOGRAPHY™ lithography system, as used by the present assignee. System 10 is described in great detail in aforementioned U.S. patent application Ser. No. 09/854,226, filed May 10, 2001.

Lithography system 10 of the present invention includes, in order along an optical axis A1, a radiation source 14 electrically connected to a radiation source controller 16. In the present invention, the term "radiation source" includes a flash lamp containing a gas fill that emits flashes (i.e., pulses) of radiation in the same part of the spectrum for which the projection lens (discussed below) is corrected. For example, a xenon-filled flash lamp emits radiation in the UV part of the spectrum from 150 nm through the visible blanketing the regions where the resists used for lithography are sensitive. Using suitable band-pass filters a portion of the spectrum matched to the characteristics of the projection lens and the resist is readily selected for use. In bump lithography, the temporal pulse length from the lamp might be in the 100 microsecond to 5 millisecond range and the minimum feature formed by the optical system might be 25 to 50 microns wide. Another suitable radiation source 14 is a laser-driven xenon plasma source operating at a wavelength in the 6 nm–14 nm wavelength region of the electromagnetic spectrum.

Yet another radiation source 14 is a laser of the appropriate wavelength with a relatively long pulse duration (e.g., one microsecond). The relatively long radiation pulses may be formed by passing a continuous-wave laser beam through a modulator that periodically interrupts the beam. Another possible radiation source 14 is provided by the new laser diodes that operate in the near UV with good conversion efficiency.

Optionally included adjacent radiation source 14 is a pulse stabilization system 18 for providing pulse-to-pulse uniformity of the radiation pulses emitted from the radiation source in the case where the radiation source pulse-to-pulse stability needs to be improved.

Further included in system 10 along axis A1 is an illumination system ("illuminator") 24 and a mask holder system 30 capable of movably supporting a mask M at a mask plane MP. Mask holder system 30 is the focus of the present invention and is described in greater detail below.

With continuing reference to FIG. 1, mask M includes a top surface 31 and a bottom surface 32 that includes a pattern 34. Pattern 34 may be a binary (e.g., a chrome pattern on clear glass), or a phase mask (e.g., phase changes generated by a patterned phase-inducing dielectric material), or a combination of the two. Mask M is typically quartz or other suitable material transparent to the wavelength of radiation from radiation source 14, except where mask M is a reflective mask and the substrate material transmittance is of no consequence. In the case where system 10 employs EUV radiation, mask M is reflective, and system 10 is folded accordingly. A binary reflective mask is created by forming a reflective layer atop a substrate and then forming a pattern atop the reflective layer using an absorber layer. Exemplary mask M suitable for use in the present invention are described in greater detail below.

System 10 also includes a projection lens 40 having an object plane OP arranged substantially coincident with mask plane MP, an aperture stop AS and an image plane IP. A workpiece stage 50 is arranged adjacent projection lens 40 at or near image plane IP and has an upper surface 52 capable of movably supporting a workpiece W having an image-bearing surface WS. In a preferred embodiment of the present invention, workpiece W is a semiconductor wafer, and upper surface WS is an image-bearing surface comprising a layer of photoresist.

With continuing reference to FIG. 1, electrically connected to workpiece stage 50 is a workpiece stage position control system 60, which includes a metrology device 62 for accurately measuring the workpiece stage position. Metrology device 62 is electrically connected directly to radiation source controller 16 so that the motion of workpiece stage 50 and the activation of radiation source 14 can be coordinated. Stage position control system 60 is capable of positioning workpiece W with high precision relative to projection lens 40 or other reference.

Workpiece stage 50 preferably has movement capability in all 6 degrees of freedom. Existing air-bearing and magnetically levitated ("maglev") workpiece stages and stage position control systems are capable of providing such movement, as well as high scan speeds (e.g., in excess of 100 mm/s) and are thus suitable for use with the present invention. Exemplary workpiece stages 50 are described in U.S. Pat. No. 5,699,621, and in the article by M. E. Williams, P. Faill, S. P. Tracy, P. Bischoff, and J. Wronosky, entitled *Magnetic levitation scanning stages for extreme ultraviolet lithography*, ASPE 14$^{th}$ annual meeting, Monterey Calif., November 1999, which patent and article are both incorporated herein by reference.

The ability of workpiece stage 50 to move in the X- and Y-planes and rotate about the Z-axis is necessary for properly positioning mask images on image-bearing surface WS of workpiece W. Z-axis movement capability, along with angular adjustment capability about the X- and Y-axis (pitch and roll), is necessary for keeping the workpiece surface within the shallow depth of focus of projection lens 40. The Z-position of the image-bearing surface WS (which is also the focal surface) of workpiece W can vary between exposure fields if the workpiece is not perfectly flat. Similarly, small rotations about the X- and Y-axis can also occur. Accordingly, metrology device 62, which in an example embodiment is an interferometer, is preferably included as part of stage position control system 60 for accurately measuring the coordinates of workpiece stage 50 relative to projection lens 40, and for providing this positioning information to radiation source control system 16.

With continuing reference to FIG. 1, a focus system 70 is arranged (e.g., adjacent projection lens 40, as shown) in operative communication with workpiece W and senses the position of image-bearing surface WS of the work piece with respect to projection lens 40. Focus system 70 generates electrical signals, which are sent to control system 60 and result in adjusting the axial (Z) position of the workpiece by means of workpiece stage 50.

System 10 further includes an alignment system 72 arranged in optical communication with workpiece W for aligning the workpiece with respect to a reference (e.g., the image of a mask alignment key imaged on the workpiece by projection lens 40). A workpiece handling system 80 in operable communication with workpiece stage 50 is provided for transporting workpieces between the workpiece stage and a workpiece storage unit 84. A system controller 90 is electrically connected to radiation source controller 16, pulse stabilization system 18, illumination system 24, mask holder system 30, workpiece stage position control system 60, focus system 72, alignment system 70, and workpiece handling system 80, and controls and coordinates the operation of these systems.

Impact of Mask Motion on Flash-lamp Exposure

Assume that it is desired to perform single-pulse lithographic exposures using a 1X-projection lens having a 22×22-mm lens field (which produces a 22×22 mm exposure field) and a flash-lamp radiation source 14 that flashes (pulses) 10 times per second. In order to place one exposure field adjacent another without overlap, the workpiece stage must scan the workpiece at scanning velocity $V_s$ given by:

$$V_s=(\text{exposure field width w})(\text{pulse rate p})=(22 \text{ mm}) (10/\text{second})= 220 \text{ mm/sec}. \quad (1)$$

Assume mask M is made to oscillate with a half-amplitude A at an angular velocity ω. The mask position x at time t is given by:

$$x\omega=A \sin \omega t \quad (2)$$

Also, the angular frequency ω is given by:

$$\omega=2n\pi p=20\pi/\text{sec} \quad (3)$$

The mask oscillating velocity $V_r$ is given by:

$$V_r=A\omega \cos \omega t \quad (4)$$

Since projection lens 40 is assumed to be 1X in this example, the velocity of the mask image ("the mask image velocity") equals the mask velocity, except perhaps for a sign change due to negative magnification (i.e., −1X magnification). If it is also assumed that exposure of workpiece W occurs where the mask image is at its maximum velocity, then:

$$V_s=V_{r\,max}=A\omega$$

$$A=V_s/\omega=(220 \text{ mm/sec})/(20 \pi/\text{sec})$$

$$A=3.50 \text{ mm} \quad (5)$$

In the present invention, the entire mask M is illuminated. Thus, with an oscillation amplitude on the order of several millimeters, it may be necessary to adjust the illumination field at mask plane MP to cover an area sufficient to fully illuminate the mask over the entire range of motion.

The maximum acceleration of the mask $a_m$ is given by:

$$a_m = A\omega^2 \quad (6)$$
$$= (3.5 \text{ mm})(20n/\text{sec})^2$$
$$= 13{,}819 \text{ mm/sec}^2$$
$$= 1.4 \text{ g.}$$

It was shown in aforementioned U.S. patent application Ser. No. 09/854,226 that the effect of image smear during a single-pulse exposure could be ignored provided that the mask image motion associated with the movement of workpiece W during the exposure has a length L that is a small fraction of the wavelength L corresponding to the highest possible spatial frequency passed by the projection system. This length is twice the minimum possible feature size and is given by:

$$L=0.5\lambda/NA \quad (7)$$

where NA is the numerical aperture of projection lens 40 and λ is the exposure wavelength.

If it is assumed that the image smear is linear and extends over a distance s, then the loss in image modulation amplitude at the highest possible spatial frequency L is given by:

$$L=1-(\sin x)/x \quad (8)$$

and $$x=\pi s/L \quad (9)$$

Using equation (7) for L:

$$x=2 \pi (s)(NA)/\lambda \quad (10)$$

Using equation (8) and setting the allowable image modulation amplitude loss equal to 5%, the result is:

$$(\sin x)/x=0.95 \text{ (11)} \quad (11)$$

and solving for x:

$$x=0.5519$$

Using equation (10), it is now possible to solve for the corresponding amount of image smear s for, say, NA=0.16 and λ=365 nm (i-line):

$$s = x\lambda/2nNA$$
$$= (.5519)(.365\ \mu)/2n(0.16)$$
$$= 0.2\ \mu$$

This is the maximum allowable amount of linear, image smear for the example lithography system 10. In this case image smear is introduced by differences between the harmonic motion of the mask and the linear motion of the workpiece and is a cubic type of smear i.e., the velocity of the mask is slightly too slow at the beginning and at the end of the exposure flash. However, to a first order approximation we can assume the limit for cubic smear is the same as that for linear smear.

Thus, the mask image smear S generated by the oscillatory motion of the mask is given by:

$$S = A\sin\omega t - A\omega t \tag{12}$$

where t is the time measured from the center of the exposure pulse. Thus, $$S = A(\omega t - 1/6\ (\omega t)^3 + \ldots) - A\omega t$$
$$S \approx A(\omega t)^3/6 \tag{13}$$

Since an equal amount of image smear is generated before and after perfect synchronization, the maximum pulse duration D is given by:

$$D = 2t = 2(6S/A\omega^3)^{1/3}$$
$$D = 2(6(0.2\ \mu)/3.5\times10^3\ \mu)\ (20\ \pi/\mathrm{sec})^3)^{1/3}$$
$$D = 0.00223\ \mathrm{seconds} \tag{14}$$

If the reticle is held stationary the corresponding duration $D_s$ of the exposure would be:

$$D_s = s/V_s = 0.2\ \mu/(220\times10^3\ \mu/\mathrm{sec}) = 0.91\times10^{-6}\ \mathrm{seconds}$$

Thus, the oscillatory motion imparted to mask M extends the allowable exposure time by a factor of about 2,500. If a flash lamp radiation source is used, this extension in the allowable exposure time increases the amount of energy that is attainable by a factor of about 50.

For single-pulse lithographic applications, the range of half-amplitudes A of the oscillatory motion of the mask will typically range from about 1 mm to about 1 cm, and the range of angular frequencies will typically range from about 20 radians/second to about 200 radians/second.

The Mask Holder System

Figure 2B:
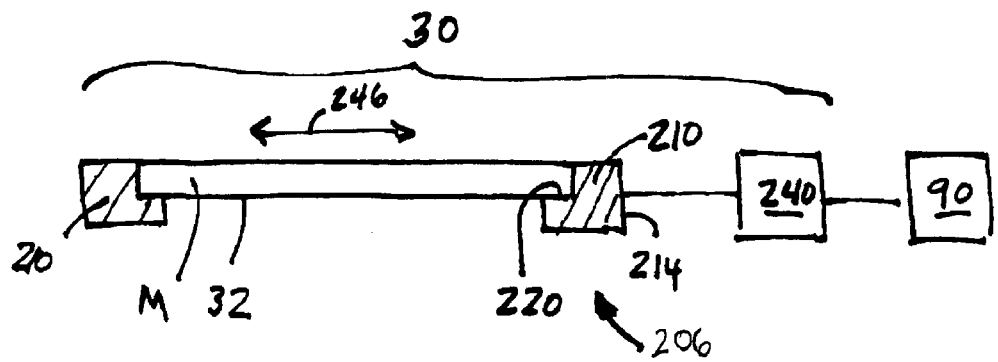
FIG. 2B is a cross-sectional view of the mask holder system of FIG. 2A taken along the line 2B—2B.
Figure 2A:
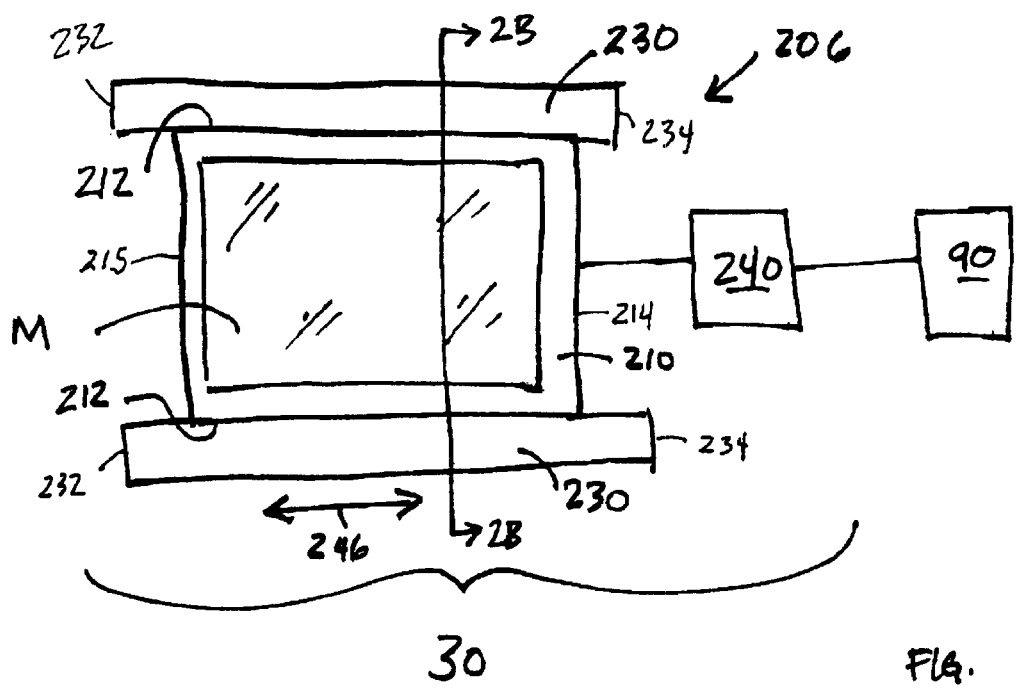
FIG. 2A is a plan view of the mask holder system of the present invention, showing the mask held in a mask frame, the rails that provide for slidable movement of the frame, and the driver unit, with the driver unit shown connected to the main controller.

With reference now to FIGS. 2A and 2B, there is shown a schematic diagram of mask holder system 30 comprising a mask support structure 206 having a mask frame 210 with opposing sides 212, third and fourth sides 214 and 215, and a lip 220 that supports mask M at mask bottom surface 32. Mask support structure 206 includes two parallel rails 230 with ends 232 and 234. Frame 210 is slidably connected to rails 230 at sides 212 so that the frame (and thus mask M held therein) can move in the plane defined by the rails. Operably connected to side 214 is a drive unit 240 for driving mask frame 210 in an oscillating motion, as indicated by double-headed arrow 246. The direction of oscillatory motion is along the line workpiece W moves beneath projection lens 40 when conducting the single-pulse exposures using system 10. Drive unit 240 is electrically connected to system controller 90, which coordinates the oscillatory movement of mask M with the movement of workpiece W.

Exemplary Mask Holder System

Figure 3:
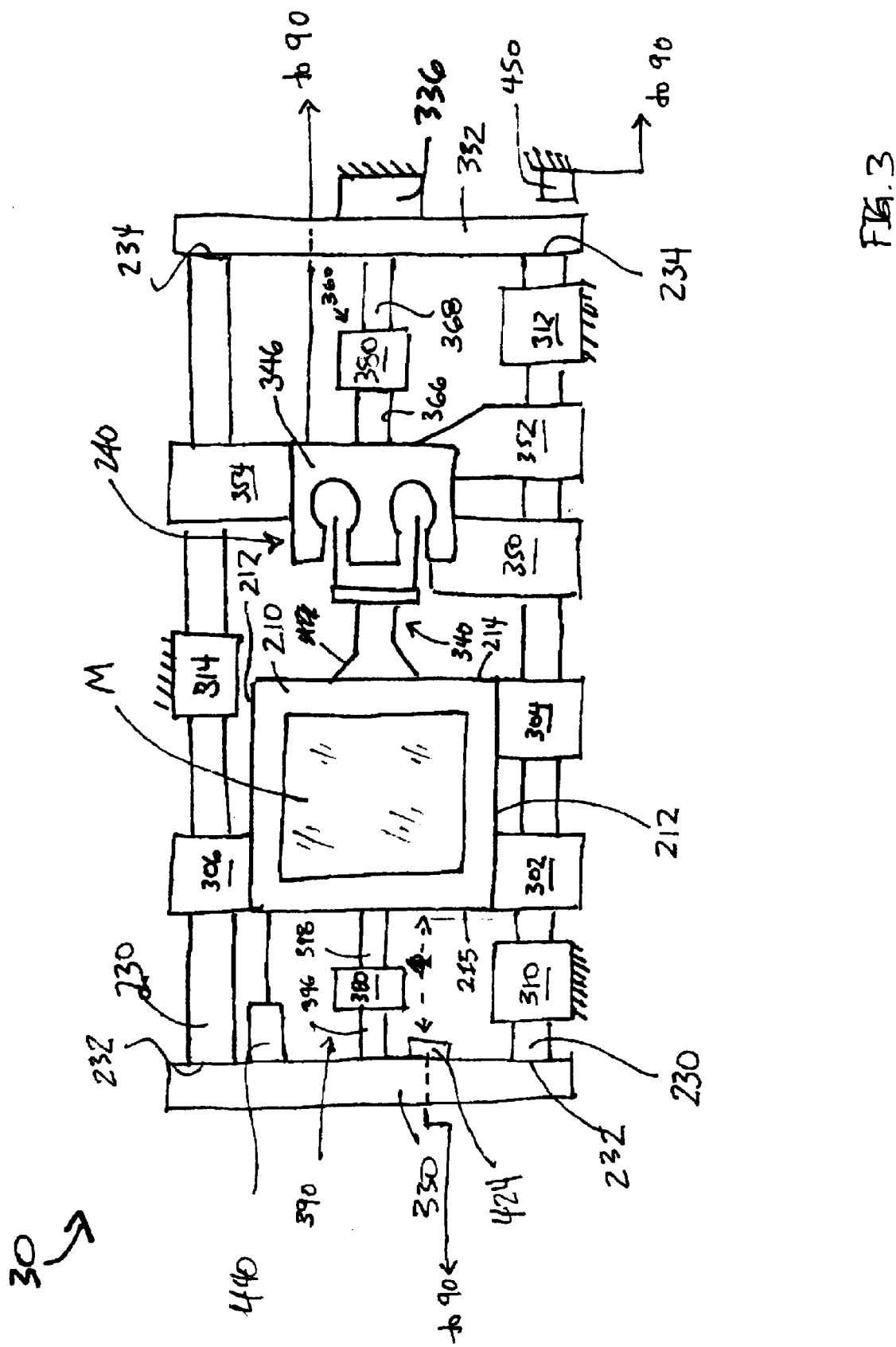
FIG. 3 is a detailed plan view of an exemplary embodiment of the mask holder system of the present invention.

With reference now to FIG. 3, there is shown an exemplary embodiment of mask holder system 30 of the present invention. Mask holder system 30 is preferably designed to cause minimal vibration and shaking of lithography system 10 when mask M is oscillated. One way to achieve isolated oscillatory motion of mask M is by moving a counterweight in the opposite direction so that no net force is applied between mask holder system 30 and the rest of system 10.

Exemplary mask holder system 30 includes, as discussed above in connection with FIGS. 2A and 2B, a support structure comprising mask frame 210 and rails 230. Frame 210 is slidably connected to parallel rails 230 by air bearings 302, 304 and 306. Rails 230, in turn, are slidably connected to lithography system 10 by air bearings 310, 312 and 314. Rails 230 are also connected to and held apart by opposing endplates 330 and 332 at respective rail ends 232 and 234. A damping pad 336 is attached to endplate 332 for damping the motion of mask holder 30 as a whole.

In the present embodiment of mask holder system 30, drive unit 240 comprises a voice coil assembly 340 operatively coupled to a magnetic assembly 346 and to mask frame 210 at edge 214. Magnetic assembly is slidably connected to rails 230 via air bearings 350, 352 and 354 and thus acts as a movable counterweight. Magnetic assembly 346 is also movably connected to endplate 332 by a central rod 360 having two sections 366 and 368 separated by a spring unit 380. The latter may be, in an exemplary embodiment, a flexure. Likewise, mask frame 210 is movably connected to endplate 330 by a central rod 390 having two sections 396 and 398 separated by a second spring unit 380.

A precision measurement gauge 424, such as a laser gauge or interferometer, is provided on isolated structure 426 (FIG. 1) (including at least projection system 40, focus system 70, alignment system 72, wafer stage metrology system 62 and the grounded parts of the structure shown in FIG. 3) that supports the projection lens and mask holder system 30. Gauge 424 may also be fixed to another reference position. Gauge 424 is in operable (e.g., optical) communication with mask frame 210 so that the position, velocity and acceleration of the mask at any particular point in time can be determined. Gauge 424 is connected to main controller 90 so that the position, velocity and acceleration information pertaining to mask M can be utilized in exposing workpiece W, as described in greater detail below.

Mask holder system 30 further includes a small drive unit 440 fixed to endplate 330 and operatively connected to frame 210 at edge 215, and a movement sensor 450 mounted to a fixed reference on system 10 (i.e., a fixed reference member). Sensor 450 may be, for example, a capacitance gauge in communication with end plate 332, as shown.

With continuing reference to FIGS. 2A, 2B and FIG. 3, in operation, mask holder system 30 moves mask M in an oscillatory fashion in the plane defined by rails 230. The oscillatory motion is initiated by passing an electric current to voice coil 340 in FIG. 3 (drive unit 240 in FIG. 2A). This generates equal and opposite forces on mask frame 210 and magnet assembly 346. Once set in motion, mask frame 210 and magnet assembly 346 oscillate in opposition due to the presence of spring units 380 by sliding on rails 230 on their respective air bearings. The oscillation frequencies of mask frame 210 and magnet assembly 346 can be made identical (or very nearly so) by ensuring that the mass of each times the spring constant of the respective spring units 380 (i.e., the deflection per unit force) are equal or nearly so.

As discussed above, the motion of mask frame 210 and thus mask M supported therein is coordinated with the emission of radiation pulses from radiation source 14 and the movement of workpiece stage 50. The motion of mask M is such that it causes the mask image to move in the direction of workpiece W when the workpiece is being exposed with a pulse of radiation. In between radiation pulses, the mask moves in the opposite direction in preparation for the next radiation pulse, as the workpiece continues to move beneath the projection lens. The smooth oscillation of mask stage 210 and magnetic assembly 346 is maintained by monitoring the amplitude of motion via sensor 424. The information from sensor 450, which indicates the amount of vibration of the mask stage assembly, is feed to main controller 90, which can initiate driver unit 440 to correct the oscillatory motion imbalance by applying a correcting force.

The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the appended claims.

What is claimed is:

1. A system to oscillate a mask to provide motion compensation for performing single-pulse exposures of the mask onto a moving workpiece, said system comprising:
    a mask frame disposed to support the mask parallel to said workpiece;
    a drive unit operatively connected to the mask frame to impart an oscillatory motion to the mask frame parallel to a direction of motion of the workpiece; and
    a system controller to coordinate the oscillation of the mask frame and the speed of movement of the workpiece.

2. A system according to claim 1, further including parallel rails slidably connected to first and second sides of the mask frame to allow the mask frame to move in a plane defined by the parallel rails.

3. A system according to claim 2, wherein the drive unit includes a voice coil operatively coupled to a magnet unit.

4. A system according to claim 3, wherein the mask frame and magnet unit oscillate in response to an electrical signal provided to the voice coil.

5. A system according to claim 2, wherein the mask frame and magnet unit are connected to the rails via air bearings.

6. A system according to claim 5, wherein the parallel rails are connected to first and second end plates at corresponding ends of the rails, and wherein the mask frame and magnetic coil are mechanically coupled to the first and second end plate, respectively, wherein each said mechanical coupling includes a spring unit that accommodates the oscillation of the mask frame and magnet assembly and minimizes the power required to maintain the oscillatory motion of the mask.

7. A system according to claim 5, further including a precision measurement gauge positioned to measure at least one of the position, velocity and acceleration of the mask frame or magnet assembly.

8. A system according to claim 5, further including a movement sensor mounted on a fixed reference member.

9. A lithography system to pattern a workpiece with exposure fields each formed from a different single pulse of radiation of a mask, said system comprising
    a mask holder system disposed to support the mask in a mask plane parallel to said workpiece;
    a drive unit operatively connected to the mask frame to impart an oscillatory motion to the mask frame and the mask in the mask plane;
    a radiation source to generate pulses of radiation having a temporal duration greater than one microsecond;
    a radiation source controller in operation communication with said radiation source to control the emission of the radiation pulses from said radiation source;
    an illuminator arranged to receive pulses from said radiation source and illuminate a mask in said mask holder system at said mask plane;
    a projection lens oriented to receive pulses of radiation having passed through the mask and adapted to form exposure fields on the workpiece;
    a workpiece stage to support the workpiece;
    a workpiece stage position control unit coupled to said workpiece stage to translate said workpiece stage and the workpiece thereon through a scan path relative to the projection lens; and
    a main controller in communication with said workpiece stage position control unit, said workpiece stage, said radiation source control unit and said mask holder system to coordinate the oscillation of the mask in the mask plane parallel to the scan path of the workpiece with the movement of the workpiece and the emission of pulses of radiation from said radiation source to reduce smearing when performing each radiation pulse exposure to create an exposure field on said workpiece.

10. A system according to claim 9, wherein said mask holder system includes a voice coil coupled to a magnetic member oriented to initiate oscillation of the mask without imparting a vibration to an isolated structure that supports the projection lens and mask holder system.

11. A system according to claim 9, wherein the radiation source is a flash-lamp.

12. A system according to claim 9, wherein the radiation source is a pulsed laser, a modulated continuous-wave laser, or a laser diode array.

13. A lithography system for performing single-pulse exposures of a moving workpiece, comprising:
    a flash-lamp to provide pulses of radiation;
    an illuminator optically coupled to the flash lamp to collect the pulses of illumination;
    a mask holder system disposed to receive and support a mask in the mask plane and oscillate the mask in the mask plane;
    a projection lens optically coupled to the illuminator to receive said pulses of illumination and to project said pulses of illumination to said mask plane to image the mask onto the workpiece;
    a workpiece stage to support and move the workpiece beneath the projection lens during imaging of the mask onto the workpiece; and
    a main controller connected to the flash-lamp, the mask holder system and the workpiece stage to coordinate the oscillation of the mask, the illumination of the mask plane, and the movement of the workpiece stage to reduce image smearing when exposing each field on the workpiece with a single pulse of radiation.

14. A system according to claim 13, wherein the flash-lamp is a xenon flash-lamp.

15. A system according to claim 13, wherein the mask holder oscillates the mask at a half amplitude of between about 1 mm and about 1 cm and at an angular frequency of between about 20 radians/second and 200 radians/second.

16. A lithography system capable of compensating for image smear when exposing an exposure field with a single pulse of radiation on a moving workpiece with a mask, said system comprising:

a radiation pulse source;

an illuminator coupled to receive radiation pulses from the radiation pulse source and to direct said radiation pulses to a mask plane;

a mask holder system to hold and oscillate said mask in the mask plane;

an optical projection lens system disposed to receive an image from the mask and to project that image onto the workpiece; and a control system coupled to the radiation pulse source, the mask holder system and the workpiece to provide pulses of radiation, and to move the mask and the workpiece to reduce image smear when forming each exposure field.

17. A method of reducing image smear when forming an exposure field with a single pulse of radiation on a moving workpiece, the method steps comprising:

a. oscillating a mask in a mask plane that is parallel to a plane of said workpiece with a direction of oscillation that is parallel to movement of said workpiece;

b. coordinating speeds of movements of said mask and said workpiece;

c. illuminating said mask with a pulse of radiation while the mask moves in the same direction as the workpiece; and d. projecting an image of the mask onto the moving workpiece.

18. A method according to claim 17, including repeatedly exposing the mask with pulses of radiation and in doing so, forming a plurality of adjacent exposure fields on said workpiece each formed by a single pulse of radiation.

19. A method according to claim 17, wherein the mask oscillation has a half amplitude of between about 1 mm and 1 cm and an angular frequency of between about 20 radians/second and 200 radians/second.

20. A method according to claim 17, wherein the means for oscillating the mask uses an electrical current to activate a voice coil coupled to a magnet assembly.

21. A method according to claim 17, including oscillating the mask within a mask system comprising a mask frame for supporting the mask and a drive unit coupled to said mask frame, wherein the mask oscillation introduces no substantial vibration outside of the mask system.

22. A method according to claim 17, wherein the pulse of exposure radiation has a temporal duration of between about one microsecond and 10 milliseconds.

23. A method according to claim 17, including adjusting the oscillation phase difference between the mask and a counterweight by providing an oscillating force to the mask or counterweight.

24. A method according to claim 17, wherein illuminating the mask includes activating a flash-lamp radiation source.

25. A method according to claim 17, wherein illuminating the mask includes activating a pulsed laser, modulating a continuous-wave laser, or activating a laser diode.

* * * * *